(12) United States Patent
Nishimori et al.

(10) Patent No.: US 6,272,743 B1
(45) Date of Patent: Aug. 14, 2001

(54) COMPONENT MOUNTING APPARATUS

(75) Inventors: Yuzo Nishimori; Susumu Takaichi, both of Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/125,704

(22) PCT Filed: Mar. 12, 1997

(86) PCT No.: PCT/JP97/00775

§ 371 Date: Aug. 24, 1998

§ 102(e) Date: Aug. 24, 1998

(87) PCT Pub. No.: WO97/34460

PCT Pub. Date: Sep. 18, 1997

(30) Foreign Application Priority Data

Mar. 12, 1996 (JP) .................................................... 8-054956

(51) Int. Cl.[7] ......................................................... H05K 3/30
(52) U.S. Cl. ............................... 29/832; 29/740; 29/840; 414/331
(58) Field of Search ............................ 29/740, 741, 832; 414/331

(56) References Cited

U.S. PATENT DOCUMENTS

| | | |
|---|---|---|
| 4,558,983 * | 12/1985 | Freeman et al. . |
| 4,621,967 * | 11/1986 | Masada . |
| 5,093,984 * | 3/1992 | Lpe . |
| 5,321,885 * | 6/1994 | Hino et al. . |
| 5,937,513 * | 8/1999 | Inutsuka et al. . |

* cited by examiner

Primary Examiner—Carl J. Arbes
(74) Attorney, Agent, or Firm—Wenderoth, Lind & Ponack, L.L.P.

(57) ABSTRACT

In a board transfer method, a board (1) prior to component placement thereon is transferred from a loader unit (15) into a component-placement position and, after the component placement is carried out, the board (1) is returned to the loader unit (15) and discharged therefrom. After the placement of components onto the board (1) in the component-placement position, the board (1) is moved from the component-placement position onto an unloader unit (9), while simultaneously transferring a succeeding board prior to component placement thereon from the loader unit (15) into the component placement position. Thereafter the unloader unit (9) is moved above the board that is in the component-placement position until the unloader unit (9) is coupled with the loader unit (15), and then the board that has been moved to the unloader unit (9), is delivered to the loader unit (15) and then discharged therefrom.

22 Claims, 5 Drawing Sheets

COMPONENT MOUNTING APPARATUS

TECHNICAL FIELD

The present invention relates to a board transfer method and apparatus, in particular, of the return-back system in which a board prior to a process, for example, component placement, is transferred onto a board positioning table such as an X-Y table by a loader unit, while another board after the component placement is transferred to the loader unit. The method and apparatus is for use in electronic component pick-and-place equipment in which electronic components are inserted or placed onto a printed circuit board.

BACKGROUND ART

In the recent years, the electronic component pick-and-place equipment is in many cases operated for batch production in terms of the flexible manufacturing system (wide-variety-of-types, low-volume production) and for environmental improvement for the production of printed circuit boards. As a result, there have arisen cases, in particular, where boards are transferred to and from a board stock rack and the electronic component pick-and-place equipment by using one robot. In the board transfer method and apparatus of this return-back system, advantageously, the installation space can be saved, while one robot will be sufficient for both the transfer of a board prior to component placement and the transfer of a board after the component placement, because the board after the component placement is returned to the position from where the board prior to component placement was transferred.

Figure 10:
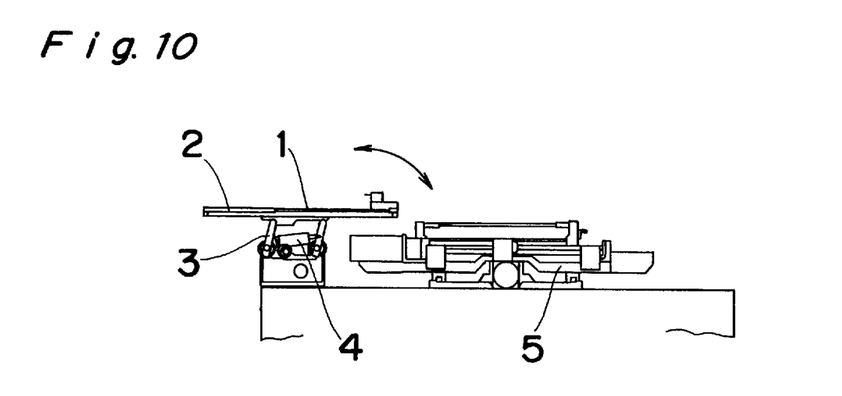
FIG. 10 is a side view of a conventional board transfer apparatus.

Conventionally, a board transfer apparatus of the return-back system as shown in FIG. 10 comprises a pair of guide rails 2 having a drive device for guiding and transferring a board 1, a link mechanism 3 for supporting the guide rails rotatably about a fulcrum, an air cylinder 4 for driving the link mechanism 3 to rotate about the fulcrum and thereby move the guide rails 2 up and down, and an X-Y table 5 for positioning the board.

With this arrangement, the board 1 on the X-Y table 5 after the component placement thereon is transferred onto the guide rails 2 that have been lowered by the air cylinder 4 and coupled with rails of the X-Y table 5. The board 1 is then moved to the other end of the guide rails 2. Subsequently, the board 1 after the component placement thereon is removed by a robot or the like, and then a board prior to component placement thereon is newly placed on the guide rails 2.

Next, the board prior to component placement thereon is transferred onto the X-Y table 5, and the guide rails 2 are driven by the air cylinder 4 so as to be moved up, and thereby separated from the X-Y table. This is the process in which boards are exchanged and transferred.

In such a conventional board transfer apparatus, on the X-Y table 5, the board 1 after the component placement thereon is transferred from the X-Y table 5 via the guide rails 2, and thereafter, a board prior to component placement thereon is transferred to the X-Y table via the guide rails 2. Therefore, much time is required for the replacement of boards, which has been an obstacle to reducing the production cycle time.

DISCLOSURE OF INVENTION

An object of the invention is to provide a board transfer apparatus of the return-back system which allows the replacement of boards from and to a board positioning table to be accomplished in short time.

In order to achieve the aforementioned object, according to a first aspect of the present invention, there is provided a board transfer method in which a board is transferred from a loader unit into a position where a process is carried out on the board and, after the process is carried out, the processed board is returned back to the loader unit and removed therefrom.

The method comprises:

after the process is carried out on the board in the position, moving the processed board from the position onto an unloader unit, while simultaneously transferring a succeeding board prior to the process being performed thereon from the loader unit into the position;

thereafter, relatively moving the unloader unit or the loader unit above the board that is in the position until the unloader unit is coupled with the loader unit; and delivering to the loader unit, and then discharging therefrom, the processed board that has been moved to the unloader unit.

delivering to the loader unit, and thereby discharging out, the processed board that has been moved to the unloader unit.

According to a second aspect of the present invention, there is provided a board transfer method according to the first aspect, wherein a succeeding board prior to the process being performed thereon is positioned in the position during a period in which the unloader unit or the loader unit is moved above the board in the position so as to be coupled with the loader unit, and further the processed board that has been moved to the unloader unit is delivered to the loader unit.

According to a third aspect of the present invention, there is provided a board transfer method according to the first aspect, wherein the process is to place components on the board and the processed board is a board after the placement of components thereon.

According to a fourth aspect of the present invention, there is provided a board transfer method according to the second aspect, wherein the process is to place components on the board and the processed board is a board after the placement of components thereon.

According to a fifth aspect of the present invention, there is provided a board transfer apparatus in which a board is transferred from a loader unit into a position where a process is carried out on the board and, after the process is carried out, the processed board is returned back to the loader unit and discharged therefrom.

The apparatus comprises:

an unloader unit for guiding and transferring a board;

a driver for moving the unloader unit or a loader unit along a direction in which the board is transferred;

a positioning table for positioning the board; and a loader unit for transferring the board, wherein the unloader unit is coupled with the loader unit above the positioning table so that the board can be delivered therebetween.

According to a sixth aspect of the present invention, there is provided a board transfer apparatus according to the fifth aspect, wherein the unloader unit is equipped with a pair of first guide rails having a drive device for guiding and transferring a board, the loader unit is equipped with a pair of second guide rails having a drive device for transferring the board, and the first guide rails of the unloader unit can be coupled with the second guide rails of the loader unit above the positioning table so that the board can be delivered therebetween.

According to a seventh aspect of the present invention, there is provided a board transfer apparatus according to the fifth aspect, wherein the process is to place components on the board and the processed board is a board after the placement of components thereon.

According to an eighth aspect of the present invention, there is provided a board transfer apparatus according to the sixth aspect, wherein the process is to place components on the board and the processed board is a board after the placement of components thereon.

According to the aspects of the invention, the board after the process such as component placement thereon is temporarily transferred from the position to the unloader unit, and then in this state a succeeding board is transferred from the loader unit to the position. The unloader unit is then coupled with the loader unit over the position, and the board is then discharged from the unloader unit to the loader unit. Therefore, the replacement of boards can be accomplished smoothly without uselessness.

This board transfer method allows the succeeding board prior to the process performed thereon to be positioned during the discharge process of the preceding board after the process has been performed thereon. Thus, the production efficiency can be enhanced.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Before the description of the present invention proceeds, it is to be noted that like parts are designated by like reference numerals throughout the accompanying drawings.

Hereinbelow, the board transfer method and apparatus according to one embodiment of the present invention are described with reference to the accompanying drawings.

Figure 5:
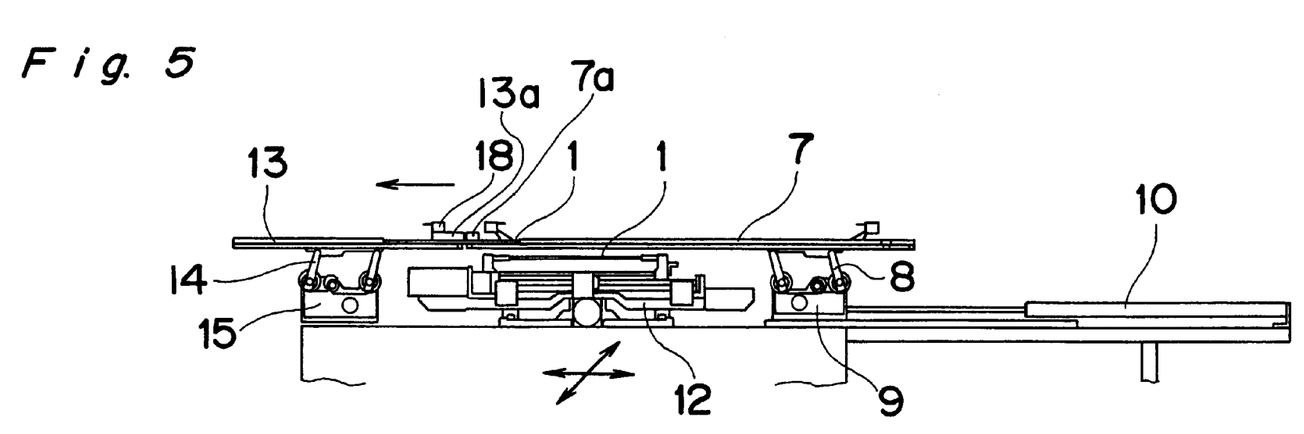
FIG. 5 is a side view showing the arrangement and board transfer operation of the board transfer apparatus according to the embodiment of the present invention.
Figure 6:
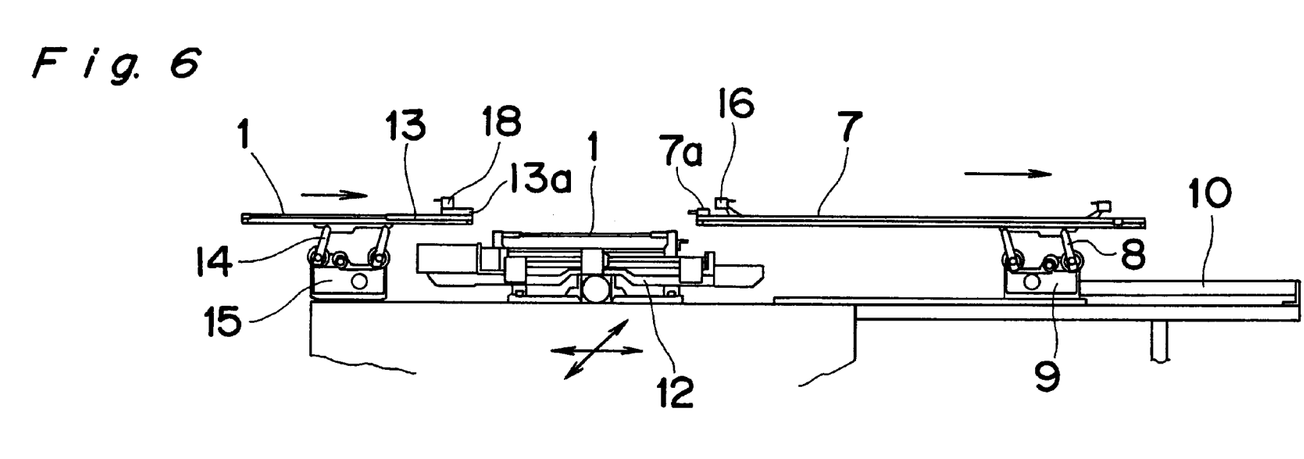
FIG. 6 is a side view showing the arrangement and board transfer operation of the board transfer apparatus according to the embodiment of the present invention.
Figure 7A:
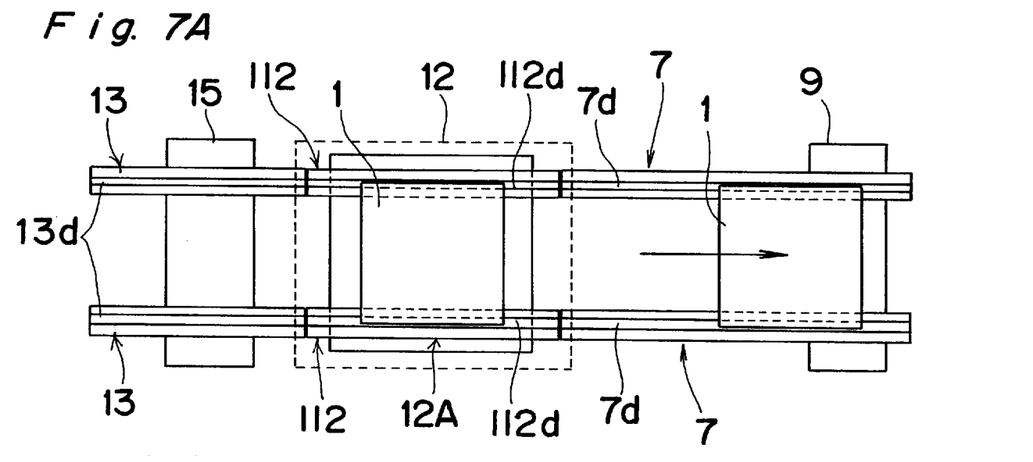
FIGS. 7A and 7B are schematic plan views showing the arrangements and board transfer operations of the board transfer apparatus according to the embodiment of the present invention corresponding to FIGS. 3 and 4, respectively.
Figure 7B:
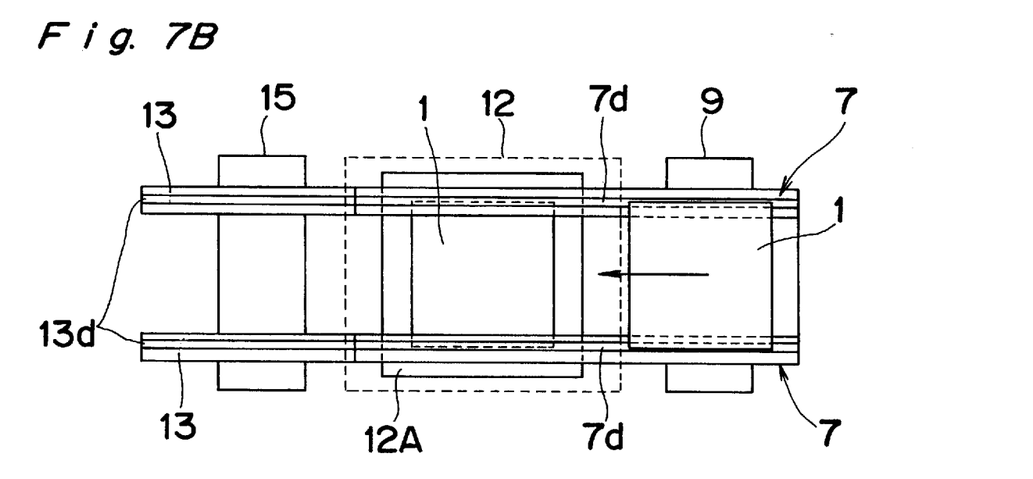
Figure 8:
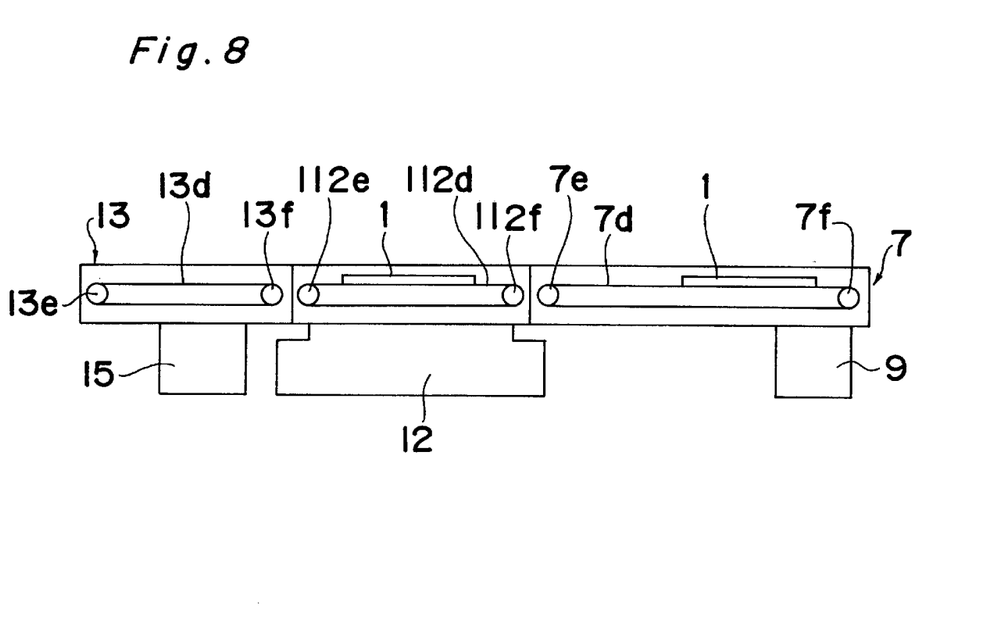
FIG. 8 is a schematic side view showing the arrangement and board transfer operation of the board transfer apparatus in FIG. 7A.

FIGS. 1 through 6 are side views of a board transfer apparatus according to the embodiment of the present invention, showing sequential steps. FIGS. 7A and 7B are schematic plan views corresponding to FIGS. 3 and 4. FIG. 8 is a schematic side view showing the arrangement and board transfer operation of the board transfer apparatus in FIG. 7A.

Referring to the figures, reference numeral 12 denotes an X-Y table, as an example of a board positioning table, disposed on a base 6 at a position where the electronic component placement is carried out. The X-Y table 12 holds a board 1 removably and horizontally by a holding portion 12A, and positions the board 1 on a horizontal plane, in which state components are placed on the board 1. On opposite sides of the X-Y table 12, an unloader unit 9 and a loader unit 15 are disposed in line with one another.

The unloader unit 9 is equipped with a pair of guide rails 7 for guiding the board 1 via parallelogrammic link mechanisms 8. The guide rails 7 have a drive device for transferring the board 1. The drive device includes a motor $7e$, a first pulley connected to a rotary shaft of the motor $7e$, and a second pulley $7f$ connected to the first pulley with a belt $7d$ so that the belt $7d$ is moved in two directions by the normal and reverse rotations of the first and second pulleys $7f$ caused by driving the motor $7e$, to transfer the board 1 on the belt $7d$. The link mechanisms 8 are each equipped with a drive mechanism similar to the air cylinder 4 of the link mechanism 3 of FIG. 10, by which the link mechanisms 8 can be rotated about fulcrums $8a$ so that the guide rails 7 are moved up and down while maintaining a horizontal state.

The unloader unit 9 is movably placed on rails 11 disposed along the direction in which the board 1 is transferred. By the drive of an air cylinder 10, the unloader unit 9 can be moved back and forth along the board transfer direction together with the first guide rails 7.

Reference numeral 13 denotes a pair of second guide rails for guiding a board 1 prior to component placement thereon, or for a guiding board 1 after component placement thereon. The second guide rails 13 are equipped with a drive device for transferring the board. The drive device includes a motor $13e$, a first pulley connected to a rotary shaft of the motor $13e$, and a second pulley $13f$ connected to the first pulley with a belt $13d$ so that the belt $13d$ is moved in two directions by the normal and reverse rotations of the first and second pulleys $13f$, caused by driving the motor $13e$, to transfer the board 1 on the belt $13d$. The second guide rails 13 are attached to the loader unit 15 via a plurality of parallelogrammic link mechanisms 14 having the same construction as the link mechanisms 8, by which the link mechanisms 14 can be rotated about the fulcrums $14a$ so that the second guide rails 13 are moved up and down while maintaining a horizontal state.

In this arrangement, the first guide rails 7 and the second guide rails 13 are further arranged so that they can be positionally set to any one of an "up position" and a "down position. " In the down position (see FIG. 2), the first guide rails 7 and the second guide rails 13 become flush with the board 1 held by the X-Y table 12 while they come into contact with both sides of the X-Y table 12, where the X-Y table 12 is connected to the guide rails 7, 13 via unknown coupling mechanisms, so that a board can be delivered from and to each of the first and second guide rails 7, 13. Although the coupling mechanisms are provided in order to ensure the connection between the first and second guide rails 7, 13 and the X-Y table 12, if possible, the coupling mechanisms may be omitted.

Figure 9:
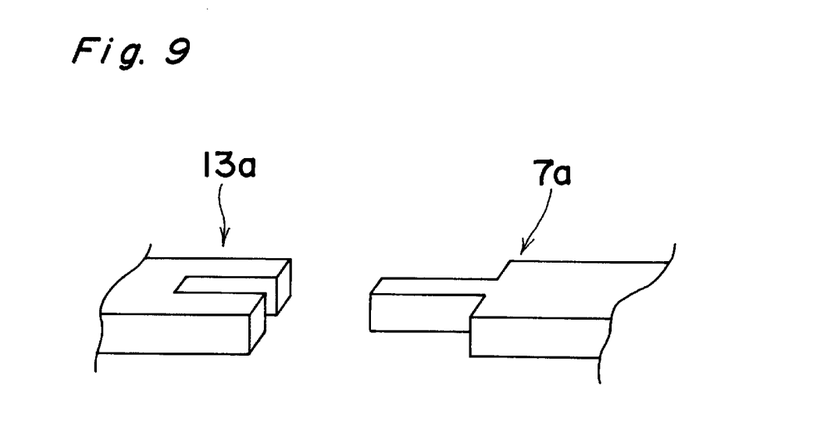
FIG. 9 is a side view showing coupling mechanisms in the embodiment.

In the up position (see FIG. 1 and FIGS. 3 to 5), the guide rails 7 and the guide rails 13 become flush with each other at a high position, i.e. at an elevation that is above the X-Y table 12. Further, both guide rails 7, 13 are identical in cross sectional shape and dimensions to each other, and placed in line with each other as shown in FIG. 7. The guide rails 7, 13 have, at their end portions on one side on which the guide rails 7, 13 are opposed to each other, coupling mechanisms 7a, 13a for connecting the guide rails 7, 13 to each other, by which a unitary board transfer path can be formed when the guide rails 7, 13 are coupled with each other so that a board can be delivered from and to each of the first and second guide rails 7, 13. FIG. 9 shows the coupling mechanisms 7a, 13a, one of which has a recess and the other of which has a projection capable of detachably engaging in the recess for connecting the guide rails to each other.

Reference numerals 16, 17 and 18 denote sensors for detecting passage and arrival of the board 1. The sensors are preferably of the light reflecting type or the light transmission type, but not limited to these.

With regard to the above arrangement, its operation and board transfer method are explained below. The transfer process for the board 1 basically comprises the following six steps, where a preliminary step shown below is included at the time of start:

Preliminary step: At a start of board transfer, in the state that the second guide rails 13 of the loader unit 15 are in the down position and are connected to the X-Y table 12, a first board 1 prior to component placement thereon is transferred from the second guide rails 13 onto the X-Y table 12 and subsequently a next board 1 prior to component placement thereon is transferred onto the second guide rails 13. Thereafter, the second guide rails 13 are lifted to the up position, where the second guide rails 13 are removed from the X-Y table 12, resulting in the state of FIG. 1, in which state the component placement is performed on the first board 1 on the X-Y table 12. In a steady-state process, since this state has resulted at the last stage of the final sixth step, it is sufficient to take into account the first to sixth steps explained below.

Figure 1:
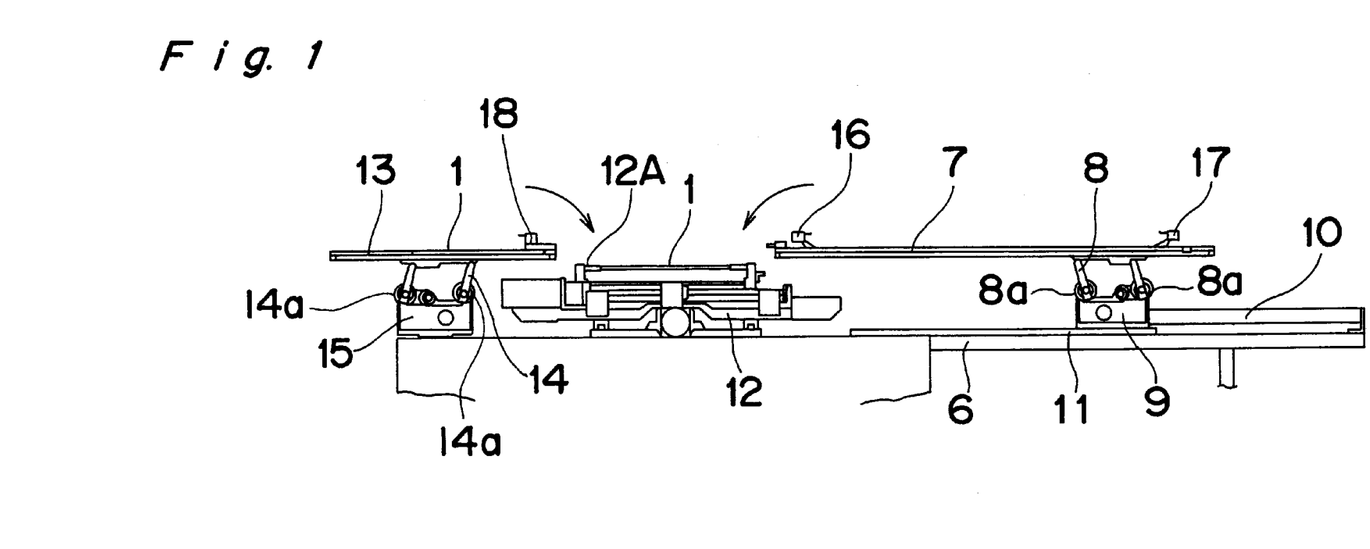
FIG. 1 is a side view showing the arrangement and board transfer operation of the board transfer apparatus according to one embodiment of the present invention.
Figure 2:
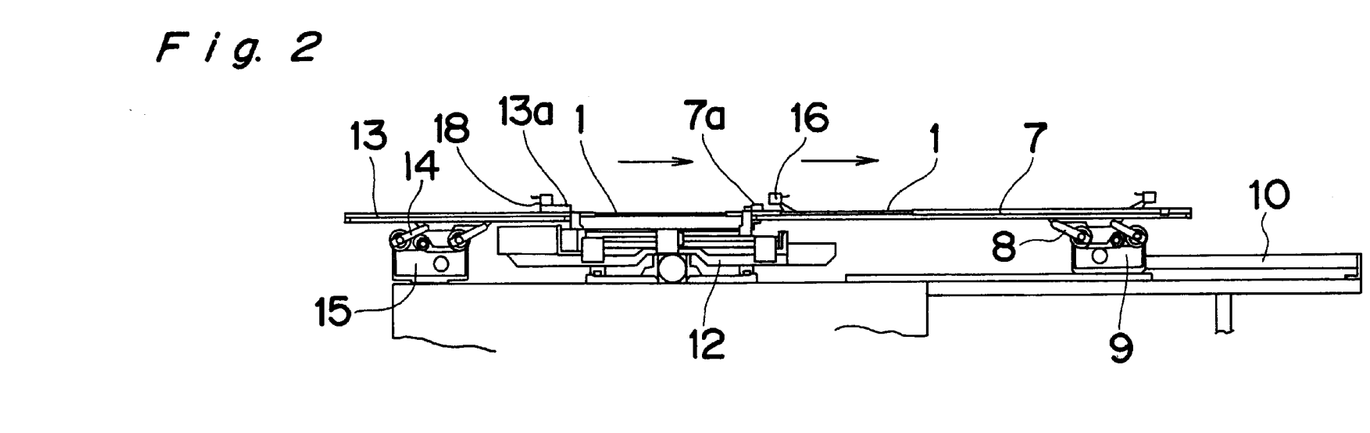
FIG. 2 is a side view showing the arrangement and board transfer operation of the board transfer apparatus according to the embodiment of the present invention.

First step: Referring to FIG. 1, a board 1 prior to component placement thereon is standing by on the second guide rails 13. There is a board 1 after component placement thereon on the X-Y table 12. With the component placement over, when the X-Y table 12 has returned into position, the first guide rails 7 and the second guide rails 13 move down so as to be joined and connected with rails 112 of the holding part 12A of the X-Y table 12 as shown in FIG. 2. The rails 112 are equipped with a drive device for transferring the board. The drive device includes a motor 112e, a first pulley connected to a rotary shaft of the motor 112e, and a second pulley 112f connected to the first pulley with a belt 112d so that the belt 112d is moved in two directions by the normal and reverse rotations of the first and second pulleys 112f, caused by driving the motor 112e, to transfer the board on the belt 112d.

Second step: Referring to FIG. 2, the board 1 after the component placement thereon, on the X-Y table 12, is transferred onto the first guide rails 7, while the board prior to component placement thereon on the second guide rails 13 is transferred onto the X-Y table 12 (into a component placement position).

Figure 3:
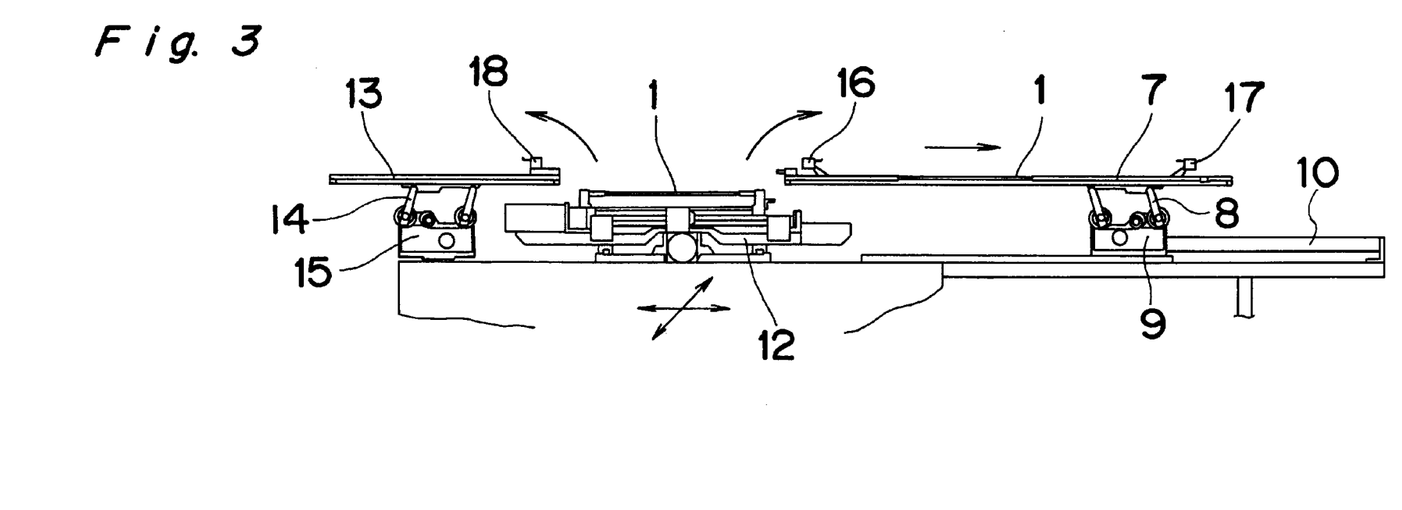
FIG. 3 is a side view showing the arrangement and board transfer operation of the board transfer apparatus according to the embodiment of the present invention.

Third step: Referring to FIG. 2, when the board 1 after the component placement thereon has passed through the position of the sensor 16 such that this board is determined to be completely transferred onto the unloader unit 9, and the board 1 prior to component placement thereon has passed through the position of the sensor 18 such that this board is determined to be completely transferred onto the X-Y table 12, the first guide rails 7 and the second guide rails 13 are moved up by the drive of their respective air cylinders such that these guide rails are removed from the X-Y table 12 as shown in FIG. 3, and the X-Y table 12 starts positioning the board 1 prior to component placement thereon. Then, the component placement is performed on the positioned board 1 on the X-Y table 12. The board 1 after the component placement thereon moves up to the position of the sensor 17, and comes to a stop there. A plan view corresponding to the side view of FIG. 3 is shown in FIG. 7A.

Figure 4:
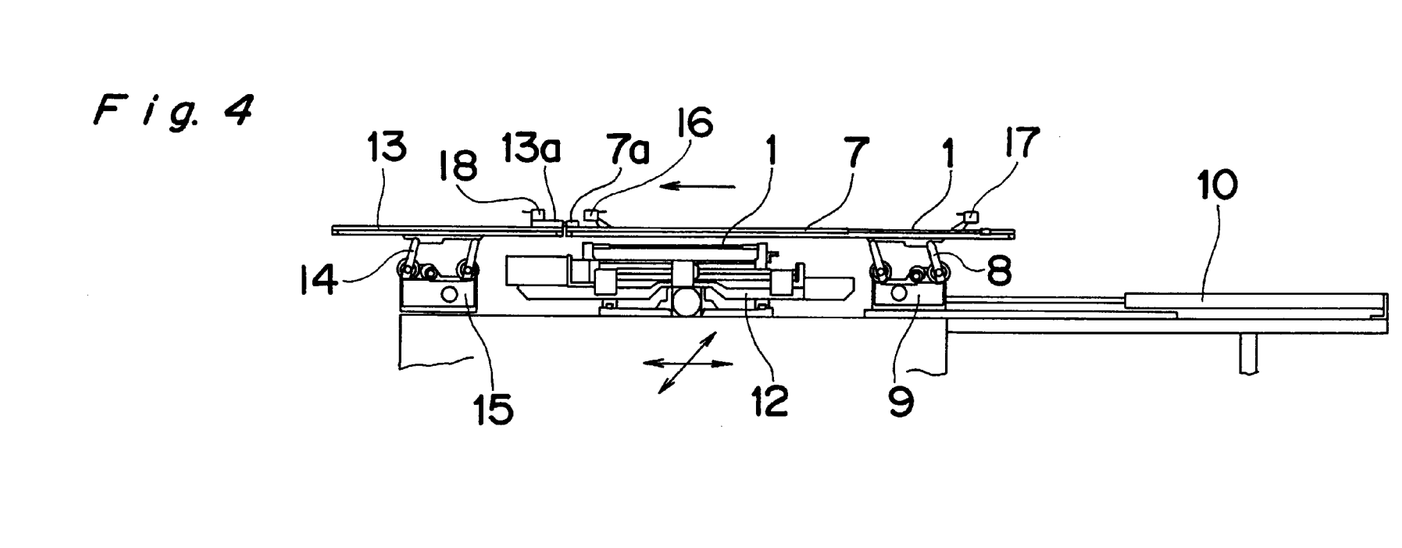
FIG. 4 is a side view showing the arrangement and board transfer operation of the board transfer apparatus according to the embodiment of the present invention.

Fourth step: Referring to FIG. 4, the first guide rails 7 attached to the unloader unit 9 are driven by the air cylinder 10 so as to move leftward, as viewed in the figure, thereby moving over and above the X-Y table 12 until one end of the first guide rails 7 come into contact with one end of the second guide rails 13 of the loader unit 15. Then, the first guide rails 7 and the second guide rails 13 are joined together by the coupling mechanisms 7a, 13a. A plan view of this state is shown in FIG. 7B.

Fifth step: Referring to FIG. 5, the board 1, after the component placement thereon, on the first guide rails 7 is transferred through the connecting portion between the first and second guide rails 7, 13, and onto the second guide rails 13, where the board 1 is removed from the second guide rails 13 by a robot or the like.

Sixth step: Referring to FIG. 5, at the stage when the board 1 after the component placement thereon has passed through the position of the sensor 18 and has been transferred onto the second guide rails 13, the first guide rails 7 are driven by the air cylinder 10 so as to be moved in such a direction away from the second guide rails 13, i.e., rightward as shown in FIG. 6, and then come to a stop at a moving end. Also, onto the second guide rails 13, a succeeding board 1 prior to component placement thereon is set up by the robot or the like and moved in the direction indicated by the arrow in the figure, i.e., toward the X-Y table 12, and then comes to a stop at the position of the sensor 18.

As shown above, the board transfer operation is iterated with the first to six steps taken as one cycle, while the transferring of boards, prior to component placement thereon and subsequent to component placement thereon, is performed in parallel with the component placement onto the boards.

In the above description, the component placement has been done in the third step. However, it is also possible to perform the component placement in the first step.

As described above, according to the board transfer method and apparatus of the embodiments of the present invention, the transfer of a board after component placement thereon from the X-Y table 12, and the transfer of another board prior to component placement thereon to the X-Y table 12, are performed at the same time. When the board 1, after component placement thereon, that has been moved to the unloader unit 9 is transferred to the loader unit 15, the first guide rails 7 are joined with the second guide rails 13 above the X-Y table 12 on which the next board is placed. Thus, an efficient board transfer is enabled in the return-back system production.

In addition, the present invention may be modified and changed in various ways without being limited to the above embodiments.

For example, although the positioning of a board and the component placement thereon have been performed in the same step in the above description, the positioning of a succeeding board prior to component placement thereon can be done simultaneously, for example, during the discharge process of the preceding board after component placement thereon. In such a case, the time required for board replacement can be shortened to an extent of the board positioning time.

Although the component placement is carried out on the board 1 in the component placement position in the embodiment, the present invention is not limited to such a component placement but can be applied to another process such as an inspection of the component, and soldering of the component in a position where such another process is carried out.

According to the present invention, it is possible to remove the preceding board after component placement thereon from the loader unit, while a succeeding board is present on the X-Y table. This allows a very efficient board transfer to be attained in the return-back system production. Also, one operating robot will be sufficient for this system, so that the facility cost can be relatively low.

Although the unloader unit is moved above the board in the embodiment, the present invention is not limited to this arrangement. That is, for example, instead of the unloader unit, the loader unit can be moved above the board that is in the position until the unloader unit is coupled with the loader unit. Also, although the unloader unit and the loader unit are moved upward and downward with respect to the board in the embodiment, the present invention is not limited to this arrangement. That is, for example, the board can be moved upward and downward by upward and downward movements of the positioning table with respect to the loader unit and the unloader unit so as to perform the same operations.

The entire disclosure of Japanese Patent Application No. 8-54956 filed on Mar. 12, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A board transfer method comprising:
    transferring a first board from a loader unit onto a support member and to a location where a process is to be performed on said first board;
    after performing the process on said first board, transferring said first board from said support member onto an unloader unit while simultaneously transferring a second board from said loader unit onto said support member; then
    above said support member, moving one of said loader unit and said unloader unit until said loader unit and said unloader unit become coupled with one another; and
    transferring said first board from said unloader unit to said loader unit.

2. The board transfer method according to claim 1, further comprising while moving one of said loader unit and said unloader unit until said loader unit and said unloader unit become coupled together, transferring said second board to a location where a process is to be performed on said second board.

3. The board transfer method according to claim 2, wherein the process performed on said first board and the process to be performed on said second board each comprises placing components on said first board and said second board, respectively.

4. The board transfer method according to claim 1, wherein the process performed on said first board comprises placing components on said first board.

5. The board transfer method according to claim 1, wherein the moving the one of said loader unit and said unloader unit until said loader unit and said unloader unit become coupled with one another comprises moving the one of said loader unit and said unloader unit until said loader unit and said unloader unit become physically coupled with one another.

6. A board transfer method comprising:
    transferring a first board from a support member onto an unloader unit while simultaneously transferring a second board from a loader unit onto said support member;
    repositioning said loader unit relative to said unloader unit; and
    transferring said first board from said unloader unit to said loader unit while said loader unit remains repositioned relative to said unloader unit.

7. The board transfer method according to claim 6, wherein the repositioning of said loader unit relative to said unloader unit includes elevating each of said loader unit and said unloader unit relative to said support member, and moving said unloader unit and loader unit relatively towards each other.

8. The board transfer method according to claim 7, wherein the repositioning of said loader unit relative to said unloader unit further includes coupling said unloader unit with said loader unit after moving said unloader unit and said loader unit relatively towards each other.

9. The board transfer method according to claim 6, further comprising removing said first board from loader unit after said first board has been transferred from said unloader unit to said loader unit, and placing a third board on said loader unit.

10. The board transfer method according to claim 9, further comprising repositioning said unloader unit and said loader unit relative to said support member, and transferring said second board from said support member onto said unloader unit while simultaneously transferring said third board from said loader unit onto said support member.

11. The board transfer method according to claim 10, wherein the repositioning of said unloader unit and said loader unit relative to said support member includes moving said unloader unit and said loader relatively away from each other, and lowering said loader unit and said unloader unit relative to said support member.

12. The board transfer method according to claim 11, wherein the repositioning of said loader unit and said unloader unit relative to said support member further includes coupling said unloader unit and said loader unit to said support member after lowering said unloader unit and said loader unit relative to said support member.

13. The board transfer method according to claim 6, wherein transferring said first board from said support member onto said an unloader unit includes sensing when said first board has been completely transferred onto said unloader unit, and transferring said second board from said loader unit onto said support member includes sensing when said second board has been completely transferred onto said support member.

14. The board transfer method according to claim 13, wherein the repositioning of said loader unit relative to said unloader unit includes repositioning said loader unit relative to said unloader unit after sensing that said first board has been completely transferred onto said unloader unit and after sensing that said second board has been completely transferred onto said support member.

15. A board transfer apparatus comprising:
   a positioning table for positioning a board while a process is performed on the board;
   a loader unit for transferring the board to said positioning table to have the process performed on the board;
   an unloader unit for receiving the board from said positioning table after the process has been performed on the board, and for transferring the board to said loader unit after the process has been performed on the board; and
   a driver for moving one of said unloader unit and said loader unit toward and away from the other of said unloader unit and loader unit along a line defining a direction in which the board is to be transferred from said unloader unit to said loader unit;
   wherein said unloader unit and said loader unit are constructed and arranged to be coupled with each other at an elevation that is above said positioning table such that the board can be transferred from said unloader unit to said loader unit.

16. The board transfer apparatus according to claim 15, wherein said unloader unit includes a first pair of guide rails and a drive arrangement for transferring the board to said loader unit, wherein said loader unit includes a second pair of guide rails and a drive arrangement for transferring the board to said positioning table, and wherein said unloader unit and said loader unit are constructed and arranged to be coupled with each other at the elevation that is above said positioning table by having said first pair of guide rails and said second pair of guide rails being constructed and arranged to be coupled with one another at an elevation that is above said positioning table.

17. The board transfer apparatus according to claim 16, wherein said positioning table for positioning a board while a process is performed on the board comprises a positioning table for positioning a board while components are placed on the board,
   wherein said loader unit for transferring the board to said positioning table to have the process performed on the board comprises a loader unit for transferring the board to said positioning table to have the components placed on the board, and
   wherein said unloader unit for receiving the board from said positioning table after the process has been performed on the board, and for transferring the board to said loader unit after the process has been performed on the board, comprises an unloader unit for receiving the board from said positioning table after the components have been placed on the board, and for transferring the board to said loader unit after the components have been placed on the board.

18. The board transfer apparatus according to claim 16, wherein said first pair of guide rails and said second pair of guide rails are constructed and arranged to be coupled with one another by providing one of said first and second pair of guide rails with projections and the other of said first and second pair of guide rails with recesses that are to receive said projections.

19. The board transfer apparatus according to claim 15, wherein said positioning table for positioning a board while a process is performed on the board comprises a positioning table for positioning a board while components are placed on the board,
   wherein said loader unit for transferring the board to said positioning table to have the process performed on the board comprises a loader unit for transferring the board to said positioning table to have the components placed on the board, and
   wherein said unloader unit for receiving the board from said positioning table after the process has been performed on the board, and for transferring the board to said loader unit after the process has been performed on the board, comprises an unloader unit for receiving the board from said positioning table after the components have been placed on the board, and for transferring the board to said loader unit after the components have been placed on the board.

20. The board transfer apparatus according to claim 15, wherein said positioning table comprises an X-Y table.

21. The board transfer apparatus according to claim 15, further comprising a first sensor for determining when the board has been transferred from said loader unit to said positioning table, and a second sensor for determining when the board has been received by said unloader unit from said positioning table.

22. The board transfer apparatus according to claim 15, wherein said unloader unit and said loader unit are constructed and arranged to be coupled with each other at the elevation that is above said positioning table, such that the board can be transferred from said unloader unit to said loader unit, by being constructed and arranged to be physically coupled with each other.

* * * * *

UNITED STATES PATENT AND TRADEMARK OFFICE
CERTIFICATE OF CORRECTION

PATENT NO. : 6,272,743 B1
DATED : August 14, 2001
INVENTOR(S) : Nishimori et al

It is certified that error appears in the above-identified patent and that said Letters Patent is hereby corrected as shown below:

<u>Title page,</u>
Insert the following references in item "[56] References Cited"

|  |  |  |
|---|---|---|
| -- 3540476 | 5/14/87 | DE (Germany) |
| 2155910 | 4/2/85 | GB (Great Britain) |
| 62-83890 | 7/10/94 | JP (Japan) -- |

Signed and Sealed this

Eleventh Day of June, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,272,743 B1  
DATED : August 14, 2001  
INVENTOR(S) : Nishimori et al It is certified that error appears in the above-identified patent and that said Letters Patent is hereby corrected as shown below:

Title page,
Insert the following references in item "[56] References Cited"

-- 3540476    5/14/87    DE (Germany)  
    2155910    4/2/85    GB (Great Britain)  
    6-283890    7/10/94    JP (Japan) --

This certificate supercedes the Certificate of Correction issued June 11, 2002.

Signed and Sealed this

Eighth Day of October, 2002

Attest:

Attesting Officer

JAMES E. ROGAN  
*Director of the United States Patent and Trademark Office*